United States Patent
Ghandehari et al.

(10) Patent No.: US 6,528,398 B1
(45) Date of Patent: Mar. 4, 2003

(54) THINNING OF TRENCH AND LINE OR CONTACT SPACING BY USE OF DUAL LAYER PHOTORESIST

(75) Inventors: Kouros Ghandehari, Santa Clara, CA (US); Bhanwar Singh, Morgan Hill, CA (US); Angela T. Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 88 days.

(21) Appl. No.: 09/775,084

(22) Filed: Feb. 1, 2001

(51) Int. Cl.$^7$ ................................................ H01L 21/76
(52) U.S. Cl. ...................................... 438/551; 438/555
(58) Field of Search ................................... 438/551, 559

(56) References Cited

U.S. PATENT DOCUMENTS 5,228,654 A * 7/1993 Carpentier .................. 248/100
6,107,177 A   8/2000 Lu et al. ...................... 438/597

OTHER PUBLICATIONS

Ki–Ho Baik et al., "Comparative Study Between Gas–and Liquid–Phase Silylation for the Diffusion–Enhanced Silylated Resist Process," Journal of Vacuum Science and Technology B, vol. 9, No. 6, Nov./Dec. 1991, pp. 3399–3405.

I. Satou et al., "Sub–0. 10 um Hole Fabrication Using Bi–Layer Silylation Process for 193 nm Lithography," Semiconductor Leading Edge Technologies, Inc., Japan, pp. 80–81.

Ulrich Schaedeli et al., "Bilayer Resist Approach for 193–nm Lithography," SPIE, vol. 2724, (1996), pp. 344–354.

M. Sebald et al., "Chemical Amplification of Resist Lines (CARL)," Microelectronic Engineering 11, (1990), pp. 531–534, Elsevier Science Publishers B.V.

David Wheeler et al., "Aminodisilanes as Silylating Agents for Dry–Developed Positive–Tone Resists for Deep Ultraviolet (248nm) and Extreme Ultraviolet (13.5nm) Microlithography," SPIE, vol. 2438, pp. 762–774.

* cited by examiner

Primary Examiner—Olik Chaudhuri
Assistant Examiner—William M. Brewster
(74) Attorney, Agent, or Firm—Foley & Lardner

(57) ABSTRACT

An exemplary embodiment described in the disclosure relates to a method of fabricating an integrated circuit which includes providing a bulk layer over a semiconductor substrate, providing an imaging layer over the bulk layer, imaging the imaging layer to expose portions of the imaging layer, removing the exposed portions of the imaging layer, etching the bulk layer at locations where exposed portions of the imaging layer were removed to provide at least one aperture in the bulk layer, and silylating the bulk layer.

20 Claims, 3 Drawing Sheets

THINNING OF TRENCH AND LINE OR CONTACT SPACING BY USE OF DUAL LAYER PHOTORESIST

FIELD OF THE INVENTION

The present specification relates to the fabrication of integrated circuits (ICs). More specifically, the present specification relates to the thinning of trench, line spacing or contact spacing by use of a dual layer photoresist.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to put millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation (such as light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the tone of the coating) in a particular solvent developer. The more soluble (i.e., uncrosslinked or deprotected) areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelength range of lambda=50 to 700 angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently absorbs some of the EUV radiation. The absorbed EUV radiation results in heating of the reticle. As the reticle increases in temperature, mechanical distortion of the reticle may result due to thermal expansion of the reticle.

Both conventional projection and EUV lithographic processes are limited in their ability to print small features, such as, contacts, trenches, polysilicon lines or gate structures. As such, the critical dimensions of IC device features, and, thus, IC devices, are limited in how small they can be.

Integrated circuit (IC) fabrication techniques often utilize a photoresist material or layer to selectively form various IC structures, regions, and layers. Radiation is provided through or reflected off a mask or reticle to form an image on the photoresist layer on a semiconductor wafer. The photoresist layer is positioned to receive the radiation transmitted through or reflected off the mask or reticle. The image received by the photoresist layer corresponds to the pattern on the mask or reticle. The radiation can be light, such as ultra-violet light, vacuum ultra-violet (VUV) light and deep ultra violet light. The radiation can also be x-ray radiation, e-beam radiation, etc.

Generally, the patterned photoresist material can be utilized to define doping regions, deposition regions, etching regions, or other structures associated with an integrated circuit (IC). A conventional lithographic system is generally utilized to project the image to the photoresist material or layer. For example, conventional lithographic system includes a source of radiation, an optical system, and the reticle or photomask. The source of radiation provides radiation through the optical system and through or off of the mask or reticle. A pellicle can be employed between the mask and the wafer to protect the mask from acquiring particles on its surface which would cause defects to be printed.

According to one example of a conventional fabrication technique, light is exposed through a binary mask to a photoresist layer on a layer of material. The light can be provided at a number of different wavelengths including 248 nm, 193 nm, and 157 nm and EUV. The photoresist layer may be either a positive or a negative photoresist material.

In the case of a positive photoresist material, the light causes photochemical reaction in the photoresist layer. The photoresist layer is removable with a developer solution at the portions of the photoresist that are exposed to light through a mask. The photoresist layer is developed to clear away those portions. An integrated circuit feature, such as a gate, via, or interconnect, is then etched or doped into the layer of material, and the remaining photoresist is removed. In the case of a negative photoresist material, the light causes the photoresist layer to be removable with a developer solution at portions of the photoresist layer that are not exposed to light through the mask.

Various types of photoresist materials are manufactured by a number of manufacturers. The photoresist material can include multiple photoresist films (i.e. a multi-level resist (MLR)). According to some conventional processes, the photoresist layer is provided over an anti-reflective coating (ARC), such as silicon nitride ($Si_3N_4$) or silicon oxynitride (SiON). The anti-reflective coating is disposed above the material which is to be processed.

Conventional integrated circuit fabrication techniques may also include a process known as silylation. For example, U.S. Pat. No. 6,107,177 describes a silylation method for protecting resist and resist loss. Generally, silylation involves the introduction of a gas or a liquid containing silicon agents which react with silicon containing materials. Silicon containing agents include hexamethyl disilazane (HMDS), hexamethly-cyclotrisilazane, trimethylsilyl ethyl isocyanate and/or dimethysilyldimethylamine. Silicon containing agents may be supplied as a gas or a dry silylation method. Alternatively, silylation may be provided by employing a wet chemistry method. Often, dry chemistries can provide a more uniform and controlled silylation process. Heretofore, silylation has not been utilized to provide smaller critical feature dimensions for spaces by lateral swelling of sidewalls. Generally, silylation has been used as a hard mask on the top layer.

Thus, there is a need to pattern IC devices using non-conventional lithographic techniques. Further, there is a need to form smaller spacing feature sizes, such as, smaller contact holes and trench spaces. Yet further, there is a need to thin trench or contact spacing by using dual layer photoresist process.

SUMMARY OF THE INVENTION

An exemplary embodiment relates to a method of fabricating an integrated circuit. This method can include providing a bulk layer over a semiconductor substrate, providing an imaging layer over the bulk layer, imaging the imaging layer to expose portions of the imaging layer, removing the exposed portions of the imaging layer, etching the bulk layer at locations where exposed portions of the imaging layer were removed to provide at least one aperture in the bulk layer, and silylating the underlying bulk layer.

Another exemplary embodiment relates to a method of using a dual layer photoresist in fabricating an integrated circuit. This method can include providing a top layer and a bottom layer over a semiconductor substrate, patterning the top layer to remove portions of the top layer, etching the bottom layer to form spaces in areas of the bottom layer not covered by the top layer, and swelling the lateral sides of the spaces in the etched bottom layer in order to make spaces smaller than possible by lithography alone. The degree of swelling of the sidewalls and hence the amount of space narrowing achieved can be adjusted by duration of exposure to the silylation agent and varying the thickness of the bulk layer which is being silylated. In general, a thicker layer expands more making the space in the bulk layer narrower than when a thinner bulk layer is used.

Another exemplary embodiment relates to a method of forming narrow trenches or contact holes in a layer of photoresist. This method can include providing an imaging layer and a bulk layer, patterning narrow trenches or contact holes in the bulk layer by imaging the imaging layer and etching the bulk layer, and silylating lateral sidewalls of the patterned narrow trenches or contact holes in the bulk layer.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

Figure 1:
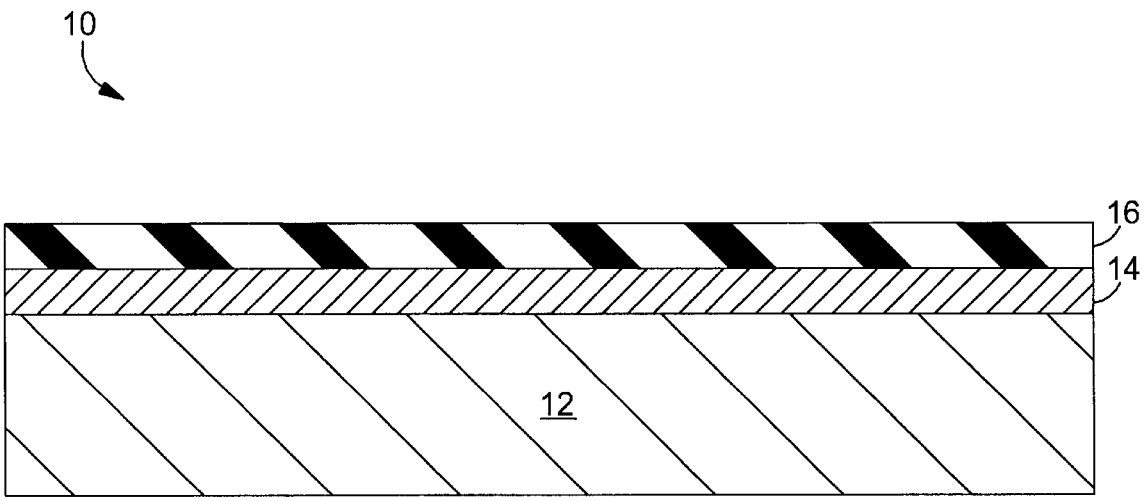
FIG. 1 is a cross-sectional view of an integrated circuit having a dual layer photoresist in accordance with an exemplary embodiment.

Referring to FIG. 1, a cross-sectional view of a portion 10 of an integrated circuit (IC) includes a substrate 12, a bulk layer 14, and an imaging layer 16. Portion 10 is preferably part of an ultra-large-scale integrated (ULSI) circuit having millions or more transistors. Portion 10 is manufactured as part of the IC on a semiconductor wafer, such as, a silicon wafer. As used in this application, the term wafer refers to any substrate used in IC fabrication processes or layer above such a substrate. The substrate or layer above can be a conductor, semiconductor, or an insulator.

Substrate 12 is preferably a semiconductor device substrate of an arbitrary layer such as oxide, nitride, or polysilicon that receives pattern transfer through etching based upon the pattern from combined effects of layers 14 and 16. Typically, the substrate represents the most recent layer of a large number of layers used sequentially to build up the semiconductor device 10. Bulk layer 14 includes a photo-crosslinking resist which is normally a negative tone resist for either a normal negative tone single layer photoresist process or the top imaging layer in a negative tone conventional silylation process. For example, materials such as Shipley XP8844 or Shipley XP3115 or other negative tone DUV photoresists could be used as bulk layer 14. Imaging layer 16 can be made (at least partially) of an inorganic resist material, such as, Ge/Se photoresist or Si containing polymer based resist. Alternatively, imaging layer 16 can be made of a thin layer or either conventional negative or positive tone resist which is effective at the wavelength used for illumination.

Advantageously, both layer 14 and imaging layer 16 are used as a dual layer imaging photoresist to create narrower spaces that are either contact holes, narrow line spaces or trenches for integrated circuit features than possible using conventional patterning means. In other words, trenches, line spacings and contact holes with narrower width are possible utilizing bulk layer 14 and imaging layer 16 than are possible using previously known methods and systems. Bulk layer 14 is deposited over substrate 12. In an exemplary embodiment, bulk layer 14 has a thickness of 500–5000 Angstroms. The thickness of bulk layer 14 can be varied to control the amount of reduction in the space etched in layer 14 by transfer from imaging layer 16. This control is possible because the sidewalls are expected to expand a certain percentage when exposed to silylating chemicals. This percentage of swelling of the sidewalls is constant for a given process which includes the chemical used and the duration of exposure. Thus, varying the thickness changes the degree to which the space is narrowed.

Bulk layer 14 and imaging layer 16 can be deposited by, for example, spin-coating over substrate 12. Spin-coating involves dispensing resist solution onto the wafer, accelerating the wafer to final rotational speed, and spinning at a constant speed to establish the desired thickness and to dry the film. After the resist coating, wafers are subjected to a temperature step called soft-bake or pre-bake. Pre-baking dries off solvent from the spun-on resist, improves adhesion of the resist, and anneals stresses caused by shear forces encountered in the spinning process. Pre-baking may be accomplished by a variety of different ovens, such as, convection, infra-red (IR), and hot plate ovens. Alternatively, for inorganic photoresists, the top imaging layer 16 is deposited by chemical vapor deposition (CVD) means.

Imaging layer 16 can be utilized to form a mask for the patterning of bulk layer 14. Imaging layer 16 can be formed from an inorganic resist material selected to be an imaging hard mask used in selectively etching bulk layer 14. In an exemplary embodiment, imaging layer 16 has a thickness of 500–2500 Angstroms. Exemplary materials for layer 16 are inorganic resists like $GeSe_2$, $Ge_{1-x}Se_x$ (x=0.25 to 0.20) or silicon containing polymers as described by Schaedli et al. in "Bilayer Resist Approach for 193 nm Lithography," SPIE Vol. 2724, p. 344 (1996). Alternatively, top lying imaging layer 16 can be a photoresist which forms a resist hard mask by either negative or positive tone resist suitable for the wavelength used for the lithographic process.

Figure 2:
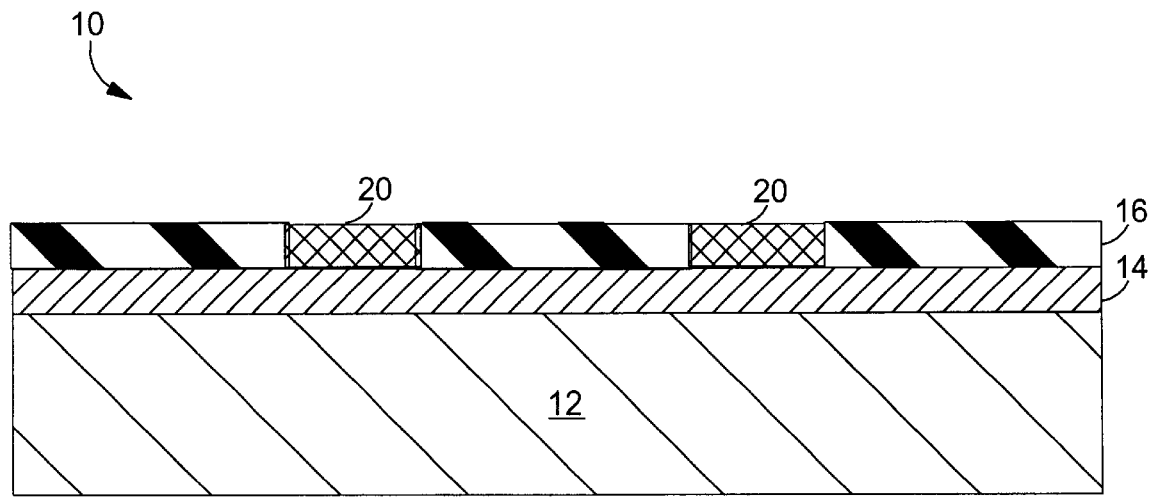
FIG. 2 is a cross-sectional view of an integrated circuit showing an imaging step.

In FIG. 2, a cross-sectional view of portion 10 illustrates exposed portions 20 of imaging layer 16 which are selected during the patterning process and dissolved by means of a conventional wet develop or dry etched to leave an etch mask for bulk layer 14. In an exemplary embodiment, patterning of imaging layer 16 is carried out using selective etching techniques. For example, radiation can be provided through a mask to imaging layer 16. The exposed areas of imaging layer 16 can be made harder or softer than the unexposed portions, depending on the patterning process used. Both bulk layer 14 and imaging layer 16 are made using separate dual imaging and image transfer systems, such as, a 248 nm stepper or scanner manufactured by ASML and a dry etcher manufactured by LAM. Alternatively, bulk layer 14 and imaging layer 16 are made using one unitary image transfer system.

Any type of lithographic technology can be used to pattern layers 14 and 16. For example, UV, deep UV, VUV, EUV lithographic equipment can be used to pattern imaging layer 16 along with dry etching equipment to pattern 14 and subsequently substrate 12 after the silylation process. The patterning process includes either a development stage in which a developer solution is provided to remove stripped portions 20 or else a dry etch process which removes stripped portion 20 which is softer than the remainder of the imaging layer 16. The developer solution is typically a solvent which renders exposed portion 20 soluble after being exposed to a sufficient amount of light energy. A dry etch is also used in the case that the developer cuts away from the underlying bulk layer 14 such that good transfer of pattern from imaging layer 16 to bulk layer 14 is not possible.

Figure 3:
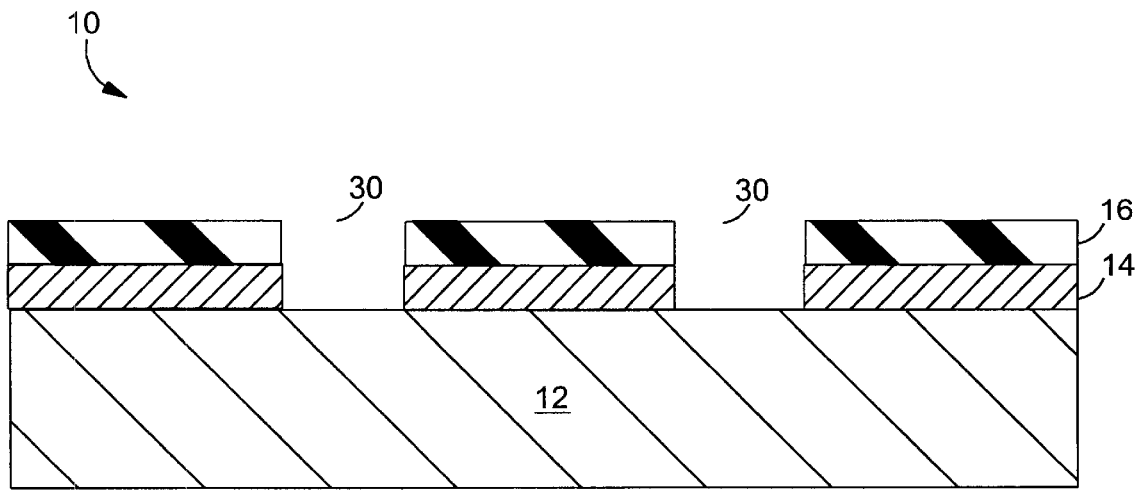
FIG. 3 is a cross-sectional view of an integrated circuit showing an etching step.

Referring now to FIG. 3, a cross-sectional view of portion 10 illustrates that after imaging layer 16 is imaged, bulk layer 14 is etched according to the patterns created by removing exposed portions 20. In an exemplary embodiment, etching techniques, such as, plasma etching or dry etching or ordinary development with developer solution are utilized. Etched portions of bulk layer 14 have a width 30. In an exemplary embodiment, width 30 is one minimum lithographic feature. In an exemplary embodiment, width 30 is 150 nm.

Figure 4:
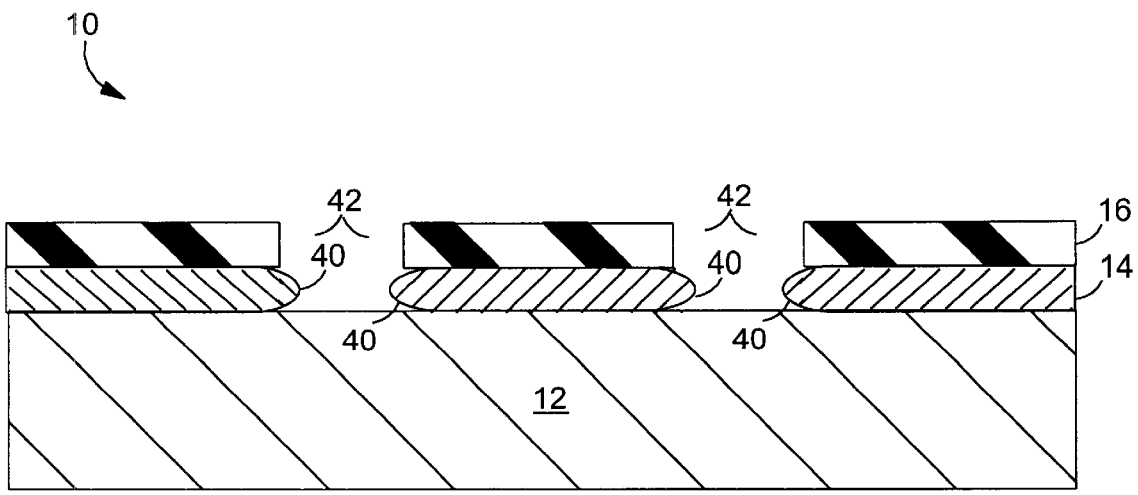
FIG. 4 is a cross-sectional view of an integrated circuit showing a silylation step.

In FIG. 4, a cross-sectional view of portion 10 illustrates that bulk layer 14 undergoes a silylation process which results in the swelling of lateral sidewalls 40 of bulk layer 14. In an exemplary embodiment, silylation is carried out by gas phase silylation or liquid phase silylation. Silylation involves the introduction of a gas or liquid containing silicon agents which react with exposed portions of bulk layer 14. This reaction results in the swelling or increasing the size of the exposed portion. Gases that can be utilized in silylation include hexamethyl disilazane (HMDS). Liquids that can be utilized in silylation include 1,2-bis (dimethylamino) tetramethyidisilane (DMAPMDS).

In an exemplary embodiment, Si-containing agents include hexamethyl disilazane (HMDS), hexamethylcyclotrisilazane, trimethylsilyl ethyl isocyanate and/or dimethylsilyldimethylamine. Si-containing agents may be supplied as a gas in a dry silylation method. One dry silylation method includes providing HMDS at a temperature between 50 and about 150 degrees Celsius, and a pressure of between about 1 and about 200 Torr. Other temperatures and pressures may be employed depending on the amount of silylation desired. For example, if it is desired to silylate a depth of approximately 30 nm, HMDS exposure time would be about 10 seconds at about 90 degrees Celsius and about 50 Torr. In alternative embodiments, silylation may be provided by employing either a wet chemistry or dry chemistry method. Dry chemistries can provide a more uniform and controlled silylation process. In exemplary embodiments, silylation occurs to a depth of between about 20 nm and 50 nm in the sidewall of bottom layer 14. As such, in an exemplary embodiment, silylated sidewalls 40 grow inward reducing the width of the spaces etched in bulk layer 14. In an exemplary embodiment, swelling of sidewalls due to silylation results in a width 42. In an exemplary embodiment, width 42 is 50 nm to 100 nm.

Advantageously, silylated sidewalls 40 grow inward to decrease the minimum size possible for spaces in bulk layer 14. After bulk layer 14 is silylated and the sizes of spaces or trenches in bulk layer 14 are decreased, bulk layer 14 and imaging layer 16 are used as a hard mask to pattern integrated circuit features. In an exemplary embodiment, integrated circuit features include contacts, trenches, or spaces in polysilicon gate layers, or any other feature utilized in integrated circuits or the manufacture of integrated circuits.

Figure 5:
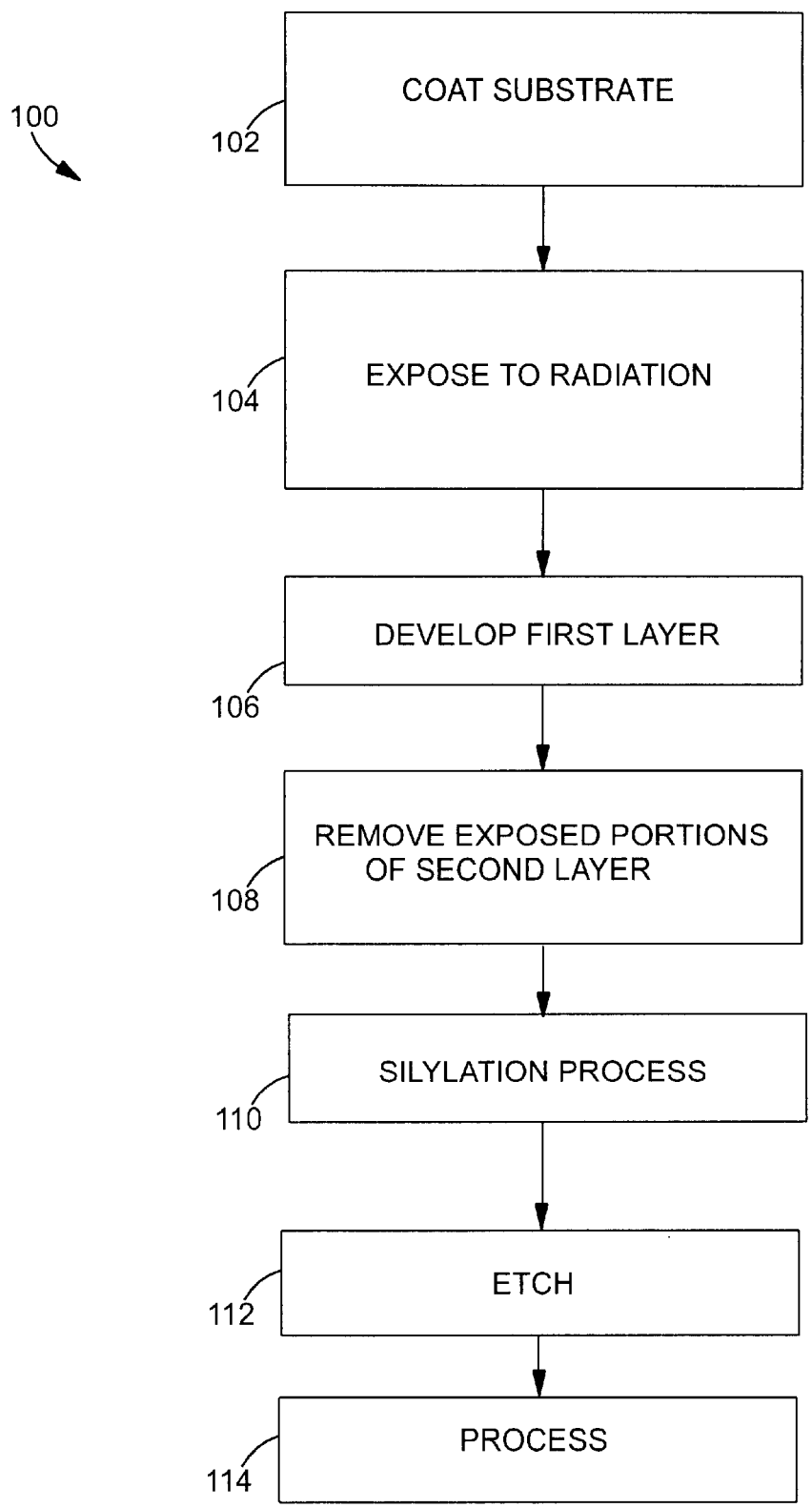
FIG. 5 is a flow diagram showing steps of the process illustrated in FIGS. 1–4 in accordance with yet another exemplary embodiment.

With reference to FIG. 5, an exemplary flow diagram 100 is described. At a step 102, substrate 12 or a layer above substrate 12 is covered by bulk layer 14 and imaging layer 16 (described with reference to FIG. 1). At a step 104, substrate 12 is placed in a chamber and exposed to radiation. The exposure of radiation provides photochemical reactions to exposed portions 20 (described with reference to FIG. 2). At a step 106, substrate 12 is processed in accordance with a development process to remove exposed portion 20. At a step 108, exposed portions of bulk layer 14 are removed (described with reference to FIG. 3). At a step 110, a silylation process is carried out in which lateral sidewalls of bulk layer 14 react with silicon agents and swell in size (described with reference to FIG. 4). At a step 112, the integrated circuit fabrication process is continued by etching substrate layer 12 masked by the combination of layers 14 and 16. At a step 114 the integrated circuit fabrication process is continued.

While the embodiments illustrated in the FIGURES and described above are presently preferred, it should be understood that these embodiments are offered by way of example only. For example, trenches or spaces in bulk layer 14 may be created in any of a variety of manners and can be made as small as possible. The invention is not limited to a particular embodiment, but extends to various modifications, combinations, and permutations that nevertheless fall within the scope and spirit of the appended claims.

What is claimed is:

1. A method of fabricating an integrated circuit, the method comprising:

providing a bulk layer over a semiconductor substrate;

providing an imaging layer over the bulk layer;

imaging the imaging layer to expose portions of the imaging layer;

removing the exposed portions of the imaging layer;

etching the bulk layer at locations where the exposed portions of the imaging layer were removed to provide at least one aperture in the bulk layer; and silylating the bulk layer.

2. The method of claim 1, wherein the bulk layer is formed at least partially of materials comprising materials used in a process of silylation.

3. The method of claim 1, wherein the imaging layer is formed at least partially of an inorganic material.

4. The method of claim 1, wherein the step of imaging the imaging layer to expose portions of the imaging layer comprises providing a mask over the imaging layer, the mask including apertures to expose the portions of the imaging layer.

5. The method of claim 1, wherein the step of silylating the bulk layer comprises providing gas phase silylation.

6. The method of claim 1, wherein the step of silylating the bulk layer comprises providing liquid phase silylation.

7. The method of claim 1, further comprising using the silylated bulk layer and the imaged imaging layer as a dual layer photoresist to pattern integrated circuit device features.

8. The method of claim 7, wherein the integrated circuit device features comprise a contact.

9. The method of claim 7, wherein the integrated circuit device features comprises spaces in a polysilicon gate layer.

10. A method of using a dual layer photoresist in fabricating an integrated circuit, the method comprising:

providing a top layer and a bottom layer over a semiconductor substrate;

patterning the top layer to remove portions of the top layer;

etching the bottom layer to form spaces in areas of the bottom layer not covered by the top layer; and swelling the lateral sides of the spaces in the etched bottom layer, wherein the step of swelling the lateral sides of the spaces in the etched bottom layer comprises silylating the bottom layer.

11. The method of claim 10, wherein the step of swelling the lateral sides of the spaces in the etched bottom layer comprises gas phase silylation.

12. The method of claim 10, wherein the top layer and the bottom layer are portions of a photoresist mask.

13. The method of claim 10, wherein the step of patterning the top layer comprises covering the top layer with a mask having apertures and exposing using a lithography system.

14. The method of claim 13, further comprising removing the portions of the top layer exposed by apertures in the mask by either liquid developer or dry etch.

15. The method of claim 13, wherein the width of the spaces in the etched bottom layer after the swelling step is 100 nm or below.

16. A method of forming narrow trenches in a layer of photoresist, the method comprising:

providing an imaging layer and a bulk layer;

patterning narrow trenches in the bulk layer by imaging the imaging layer and etching the bulk layer; and silylating lateral sidewalls of the patterned narrow trenches in the bulk layer.

17. The method of claim 16, wherein the imaging layer has a thickness of 500 nm to 2500 nm.

18. The method of claim 16, wherein the bulk layer has a thickness of 500 nm to 5000 nm.

19. The method of claim 16, wherein the patterned narrow trenches have a width of one lithographic feature.

20. The method of claim 16, wherein the width of the patterned narrow trenches after silylating the lateral sidewalls of the patterned narrow trenches is a width of 100 nm or less.

* * * * *